US011915772B1

(12) United States Patent
Sharma et al.

(10) Patent No.: US 11,915,772 B1
(45) Date of Patent: Feb. 27, 2024

(54) DATA STORAGE DEVICE AND METHOD FOR POWER ON RESET AND READ ERROR HANDLING

(71) Applicant: Western Digital Technologies, Inc., San Jose, CA (US)

(72) Inventors: Vishal Sharma, Bangalore (IN); Darshan Pagariya, Gondia (IN); Sourabh Sankule, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/902,113

(22) Filed: Sep. 2, 2022

(51) Int. Cl.
*G11C 29/02* (2006.01)
*G06F 3/06* (2006.01)

(52) U.S. Cl.
CPC .......... *G11C 29/021* (2013.01); *G06F 3/0619* (2013.01); *G06F 3/0659* (2013.01); *G06F 3/0679* (2013.01)

(58) Field of Classification Search
CPC ... G11C 29/021; G06F 3/0619; G06F 3/0659; G06F 3/0679
See application file for complete search history.

(56) References Cited

U.S. PATENT DOCUMENTS

| 2014/0359202 | A1 | 12/2014 | Sun et al. | |
| 2015/0029796 | A1* | 1/2015 | Choi | G11C 11/5642 365/189.05 |
| 2019/0080752 | A1* | 3/2019 | Hwang | G11C 11/5671 |
| 2020/0160894 | A1* | 5/2020 | Muchherla | G11C 29/52 |
| 2020/0312411 | A1* | 10/2020 | Patel | G11C 11/5642 |
| 2021/0319838 | A1* | 10/2021 | Joo | G11C 16/30 |
| 2022/0404968 | A1* | 12/2022 | Zhou | G06F 3/0614 |

* cited by examiner

*Primary Examiner* — Thien Nguyen
(74) *Attorney, Agent, or Firm* — Crowell & Moring LLP

(57) ABSTRACT

A data storage device has a controller that instructs a memory to read memory cells using a number of different read voltage levels and then selects the read voltage level that provides the best read. Instead of sending individual commands for each of the different read voltage levels, the controller sends a single command that specifies an initial read voltage level and a voltage shift, and the memory automatically increments the read voltage level by the voltage shift for each read.

20 Claims, 11 Drawing Sheets

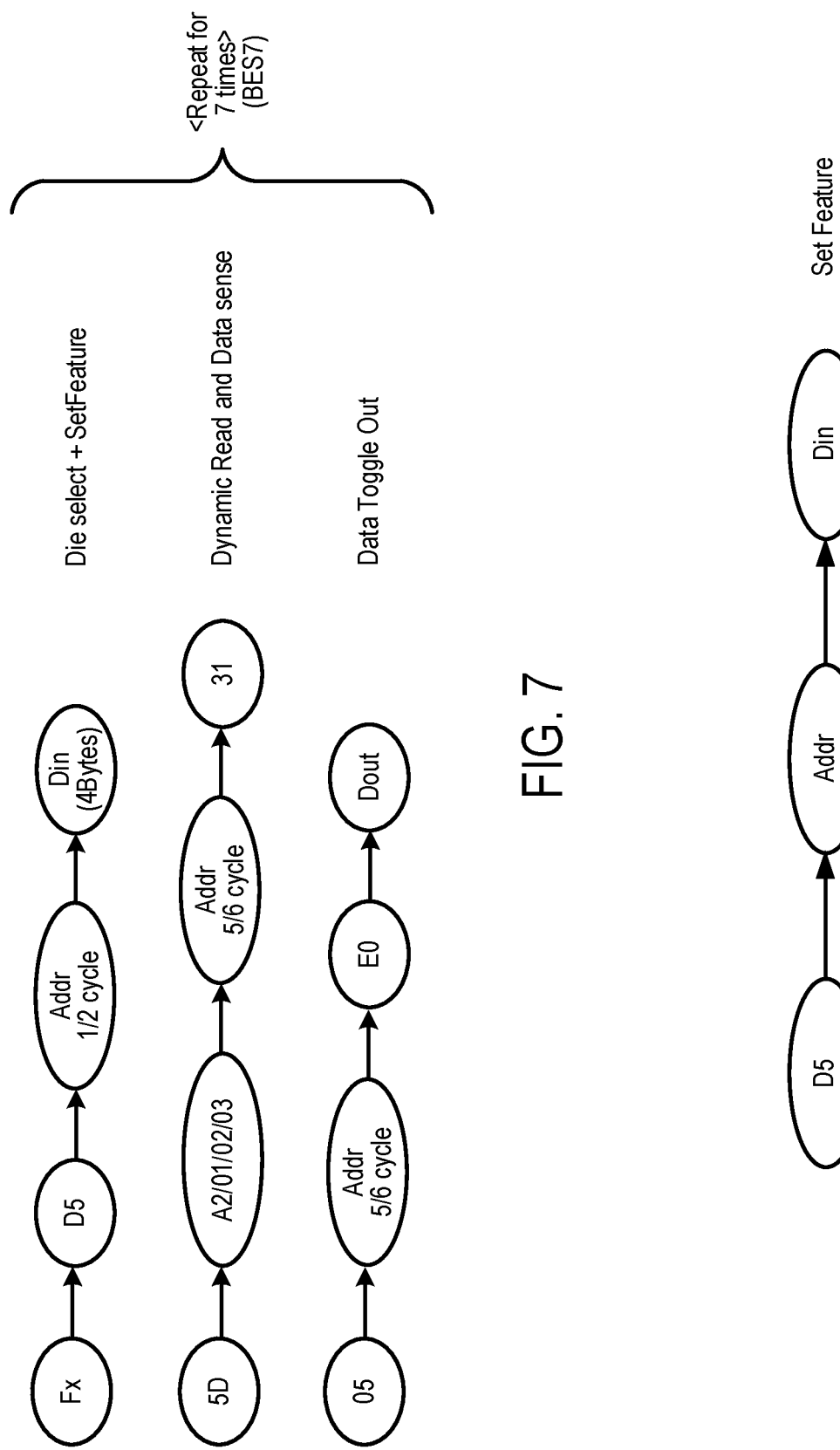

DATA STORAGE DEVICE AND METHOD FOR POWER ON RESET AND READ ERROR HANDLING

BACKGROUND

A data storage device can contain a controller and a memory. To read a memory cell in the memory, the electrical charge level of the memory cell can be compared to a voltage reference threshold to determine the programmed state of the memory cell. Over time and as a result of various physical conditions and wear, the voltage distribution of the memory cell can shift. Using a fixed voltage reference threshold in such situations can lead to errors in reading the memory cell. When the number of such errors exceeds an error correction code (ECC) correction capability of the data storage device, the read operation can fail. To reduce the likelihood of such failure, the controller of the data storage device can adjust the voltage threshold level to provide improved data recovery.

BRIEF DESCRIPTION OF THE DRAWINGS

FIG. 7 is an illustration of a command sequence of an embodiment.

FIG. 8 is an illustration of part of the command sequence of FIG. 7.

DETAILED DESCRIPTION

The following embodiments generally relate to a data storage device and method for power on reset and read error handling. In one embodiment, a data storage device is provided comprising a memory comprising a plurality of memory cells and a controller. The controller is configured to send a command to the memory that specifies an initial read voltage threshold and a voltage shift. The memory is configured to, in response to receiving the command: (a) read data from the plurality of memory cells using the initial read voltage threshold; (b) send the data read from the plurality of memory cells to the controller; and (c) repeat (a) and (b) a plurality of times, wherein, each time, the data is read from the plurality of memory cells using the initial read voltage threshold offset by a different multiple of the voltage shift.

In another embodiment, a method is provided that is performed in response to receiving, from a controller of a data storage device, a command specifying an initial voltage level and a digital-to-analog converter (DAC) shift. The method comprises: (a) reading data from a plurality of memory cells in the memory using the initial voltage level; (b) automatically incrementing the initial voltage level by the DAC shift; (c) sending the data read from the plurality of memory cells to the controller; and (d) repeating (a)-(c) N number of times, wherein N is a positive integer.

In yet another embodiment, a memory in a data storage device is provided. The memory comprises: a plurality of memory cells; and means for, in response to receiving a command from a controller of the data storage device that specifies an initial read voltage threshold and a voltage shift: (a) reading data from the plurality of memory cells using the initial read voltage threshold; (b) sending the data read from the plurality of memory cells to the controller; and (c) repeating (a) and (b) a plurality of times, wherein, each time, the data is read from the plurality of memory cells using the initial read voltage threshold offset by a different multiple of the voltage shift; wherein (a)-(c) are performed in response to receiving the initial read voltage threshold from the controller only one time. Other embodiments are provided and can be used alone or in combination.

Figure 1A:
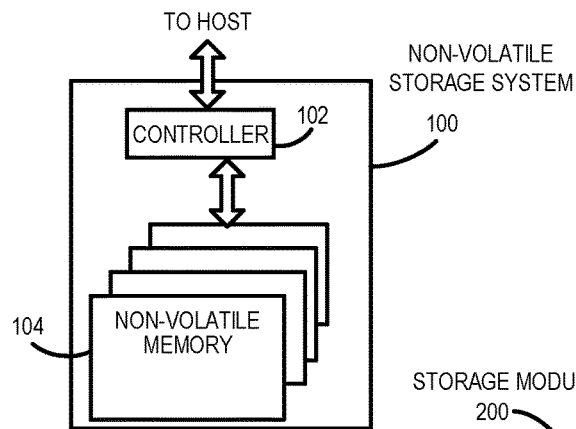
FIG. 1A is a block diagram of a non-volatile storage system of an embodiment.
Figure 1B:
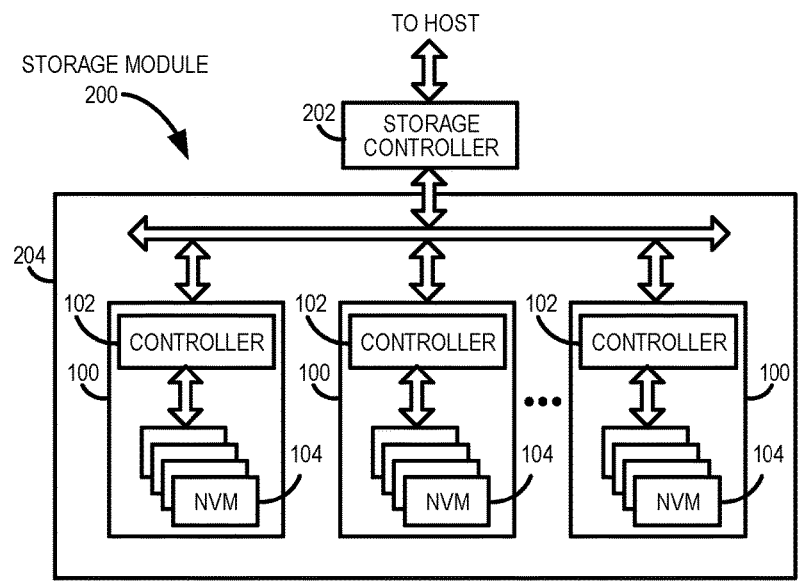
FIG. 1B is a block diagram illustrating a storage module of an embodiment.
Figure 1C:
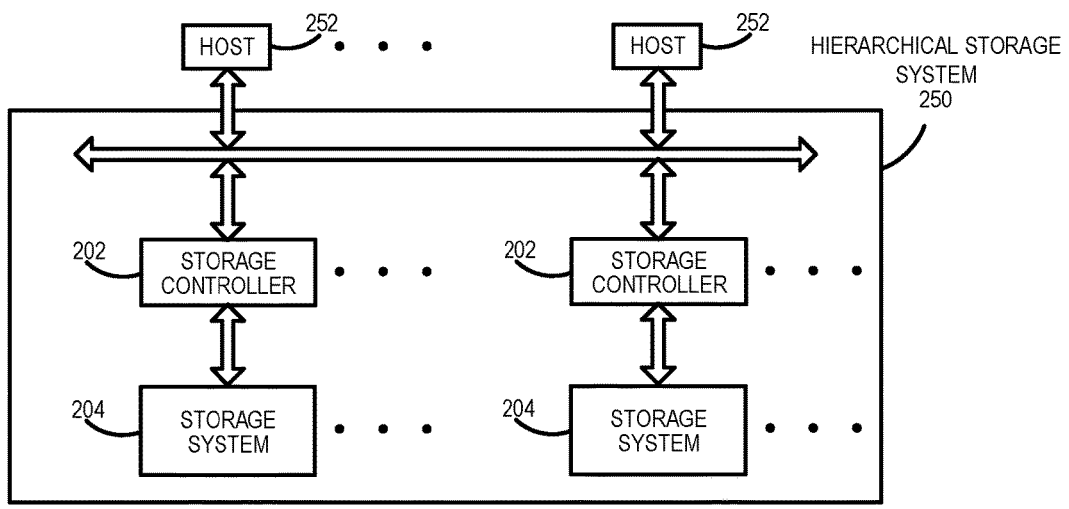
FIG. 1C is a block diagram illustrating a hierarchical storage system of an embodiment.

Turning now to the drawings, storage systems suitable for use in implementing aspects of these embodiments are shown in FIGS. 1A-1C. A storage system is sometimes referred to herein as a data storage device (DSD), which refers to a device that stores data (e.g., hard disk drives (HDDs), solid state drives (SSDs), tape drives, hybrid drives, etc.). FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magneto-resistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory cells that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including ReRAM, MRAM, PCM, NAND flash memory cells and/or NOR flash memory cells. The memory cells can take the form of solid-state (e.g., flash) memory cells and can be one-time programmable, few-time programmable, or many-time programmable. The memory cells can also be single-level (one-bit per cell) cells (SLC) or multiple-level cells (MLC), such as two-level cells, triple-level cells (TLC), quad-level cell (QLC) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card-based system, such as a secure digital (SD) or a micro secure digital (micro-SD) card (or USB, SSD, etc.). In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid-state drive (SSD), or non-volatile dual in-line memory module (NVDEVIM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
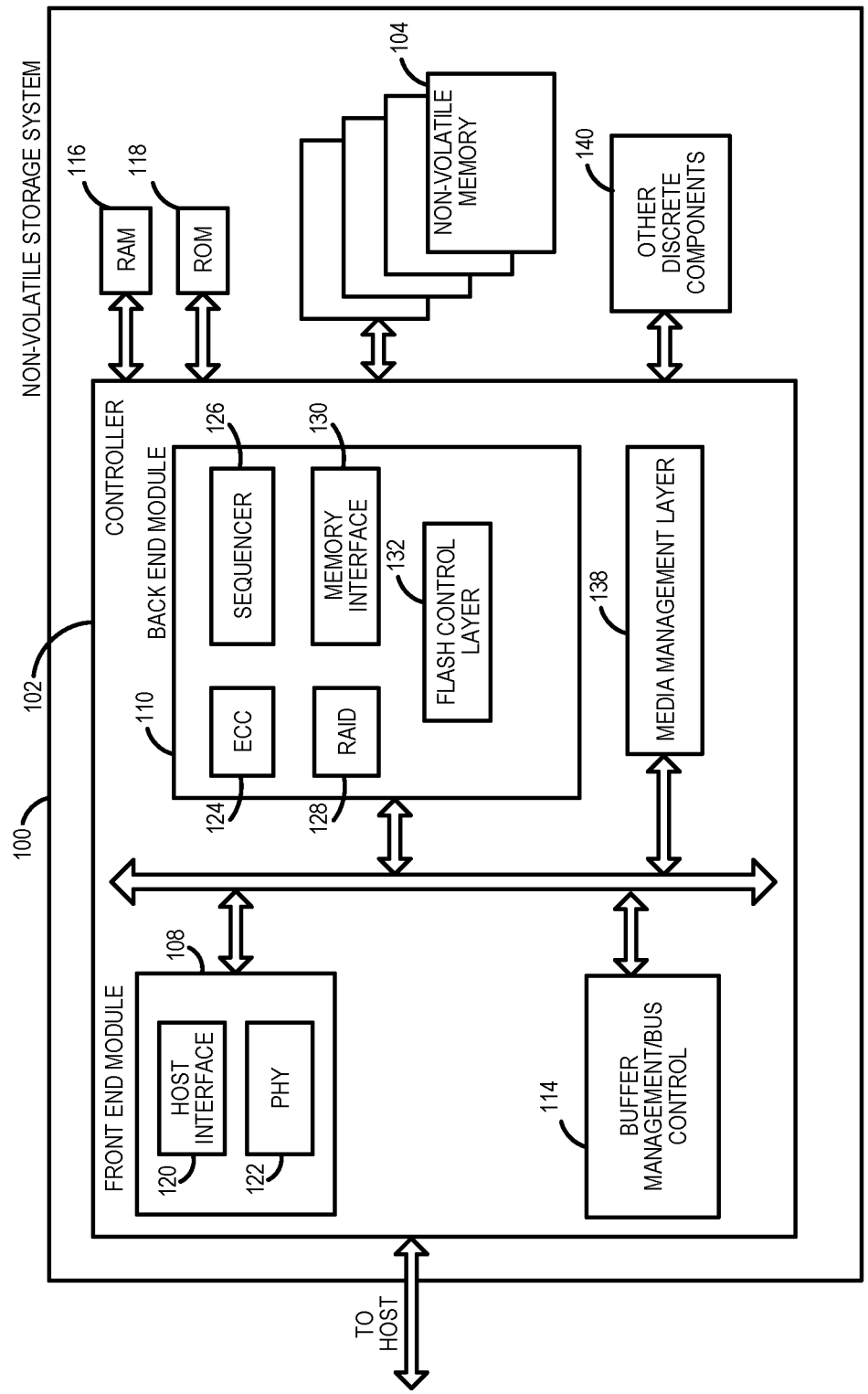
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
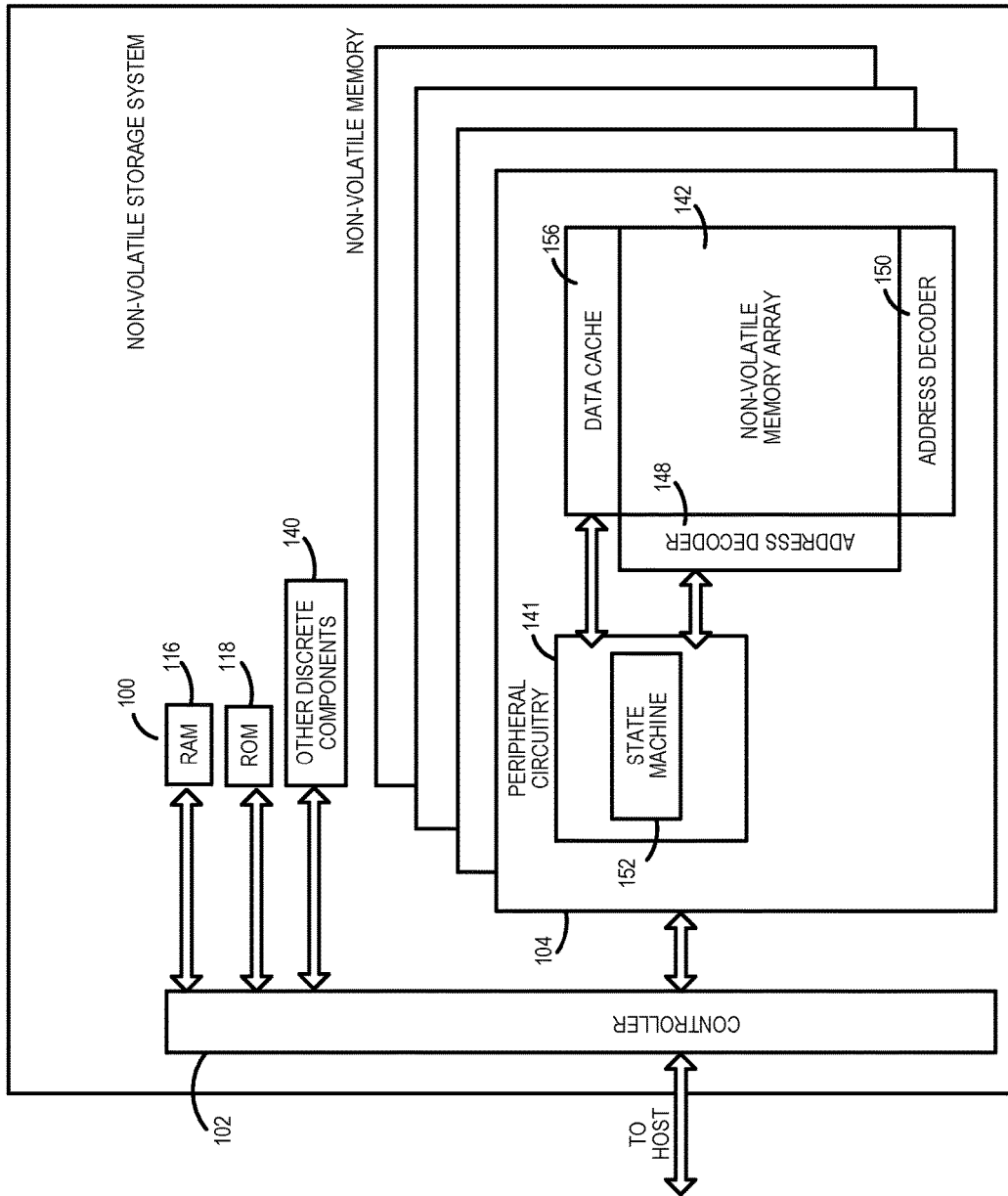
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block of memory cells. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
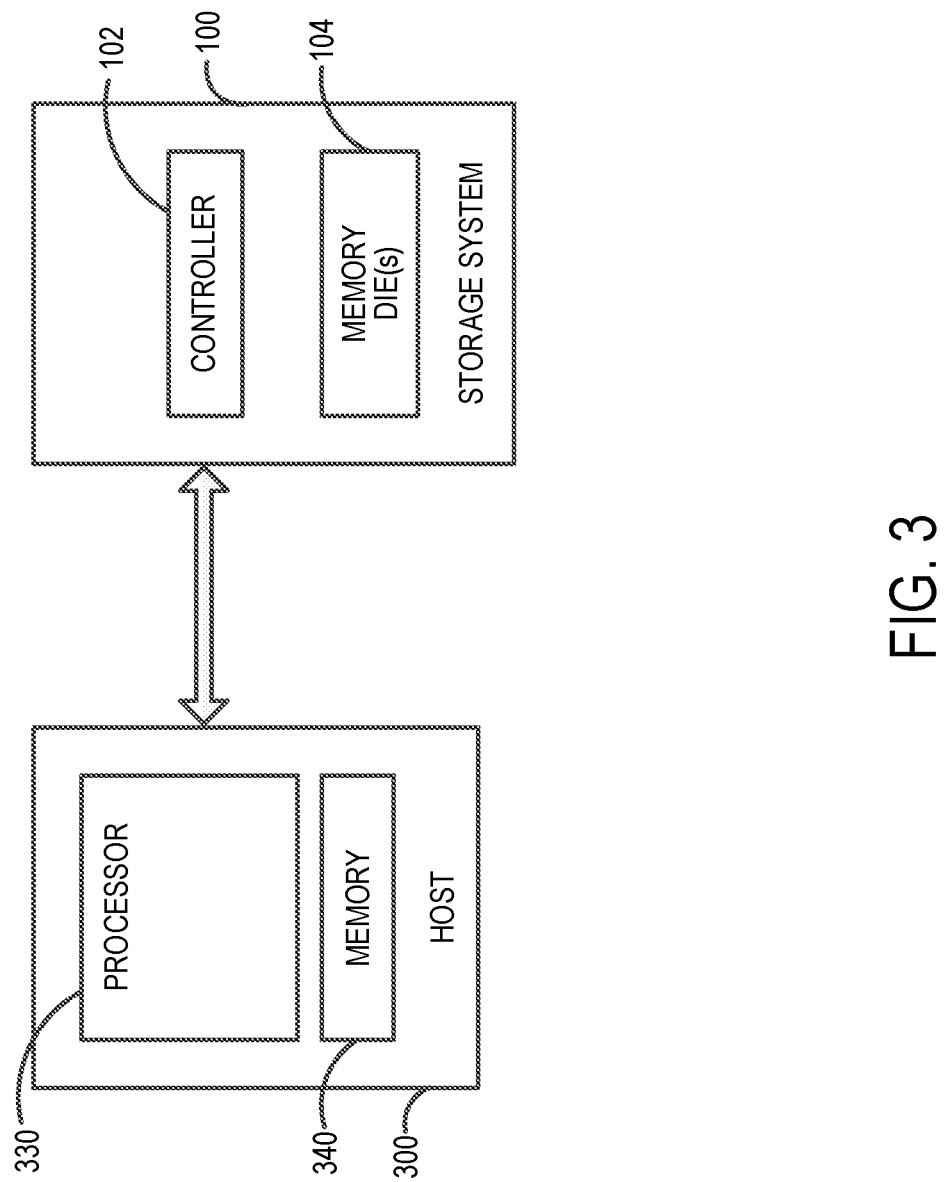
FIG. 3 is a block diagram of a host and storage system of an embodiment.

Turning again to the drawings, FIG. 3 is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340 (e.g., DRAM)) to the storage system 100 for storage in the storage system's memory 104 (e.g., non-volatile memory dies). While the host 300 and the storage system 100 are shown as separate boxes in FIG. 3, it should be noted that the storage system 100 can be integrated in the host 300, the storage system 100 can be removably connected to the host 300, and the storage system 100 and host 300 can communicate over a network. It should also be noted that the memory 104 can be integrated in the storage system 100 or removably connected to the storage system 100.

Figure 4:
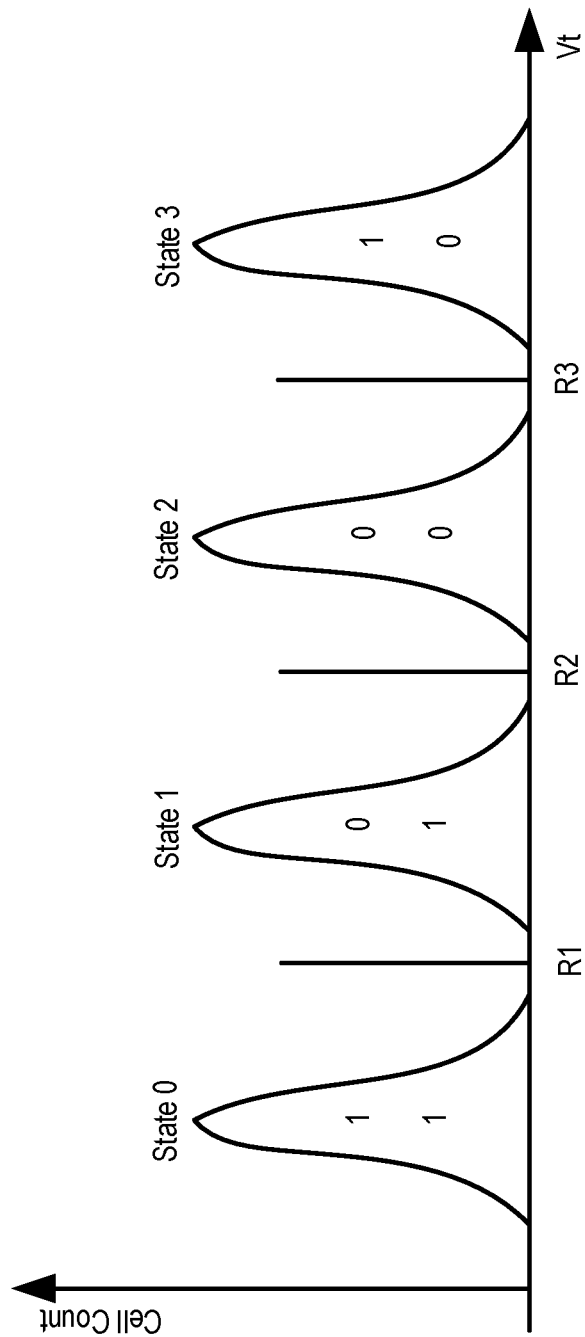
FIG. 4 is a graph showing a probability distribution of cells in a non-volatile memory of an embodiment.

As mentioned above, memory cells can be single-level cells (SLC) (one-bit per cell) or multiple-level cells (MLC), such as two-level cells (two-bits per cell), triple-level cells (TLC) (three-bits per cell), quad-level cell (QLC) (four-bits per cell), etc. FIG. 4 shows a probability distribution of a two-bit-per-cell embodiment. While a two-bit-per-cell example is shown in FIG. 4, it should be understood that this is just an example and that other types of memory cells can be used (e.g., one-bit-per-cell, three-bits-per-cell, four-bits-per-cell, etc.). The horizontal axis represents the cell voltage level, and the vertical axis represents the number of cells that have the corresponding voltage values. Thus, the four distribution curves represent the number of cells, broken down by the four distributions, which have corresponding voltage values. As shown in FIG. 4, the voltage distribution of the memory cells may include a plurality of distinct levels or states (e.g., States 0-3).

When a read operation is performed on the memory cells, the electrical charge levels of the memory cells are compared to one or more voltage reference values (sometimes referred to as "reading voltage levels" or "voltage thresholds") to determine the state of individual cells. With a SLC, the cell can be read using a single voltage reference value. With an MLC, the cell can be read using multiple, distinct voltage threshold distribution (V t) levels, each corresponding to a different memory state. As shown in FIG. 4, read reference values (i.e., voltage threshold levels R1-R3), which can be preset by a device manufacturer and stored in the memory's ROM registers, are placed between these levels.

For one wordline (WL), which can be connected to tens of thousands of memory cells in a NAND array, the lower digit of the cells may be referred to as the "lower page," and the upper digit may be referred to as the "upper page." For three-bit-per-cell flash memories, there may also be intermediate digits, which may be referred to as "middle pages." Reading voltage levels are dependent on the coding of these states. For example, for the coding shown in FIG. 4 for two-bits-per-cell, one read at R2 may be required to read out the lower page, and two reads at both R1 and R3 may be required to read out the upper page. As shown in the distribution of FIG. 4, these reading voltages may be selected between state distributions in the case where the distributions for different states are narrow so that there is no overlap between them.

The gap between the levels (i.e., the margin between programmed states) is referred to as the "read margin." Over time and as a result of various physical conditions and wear (e.g., repeated program/erase (P/E) cycles), the read margins between the various distribution levels may be reduced. As read margins are diminished or disappear, fixed read voltage levels (such as R1, R2, and R3) may prove less reliable. That is, using a fixed reading voltage level in situations where the voltage distribution of the memory cells shift can lead to errors in reading the memory cell (a "bit error"). When the number of bit errors in a read operation exceeds the error correction code (ECC) correction capability of the data storage device, the read operation can fail.

To reduce the likelihood of this situation, the controller 102 of the data storage device 100 can be configured to adjust the reading voltage levels to provide improved data recovery. In general, the controller 102 can command the memory 104 to use a plurality of different reading voltage levels and then select the reading voltage level that provides the best read (e.g., the fewest number of bit errors). This process, which is sometimes referred to as a bit-error-rate estimate and scan (BES) operation, can be performed at any suitable time, such as during initialization of the data storage device ("ROM init"), during a read error handling (REH) process, or as part of a cell voltage distribution (CVD) process.

Figure 5:
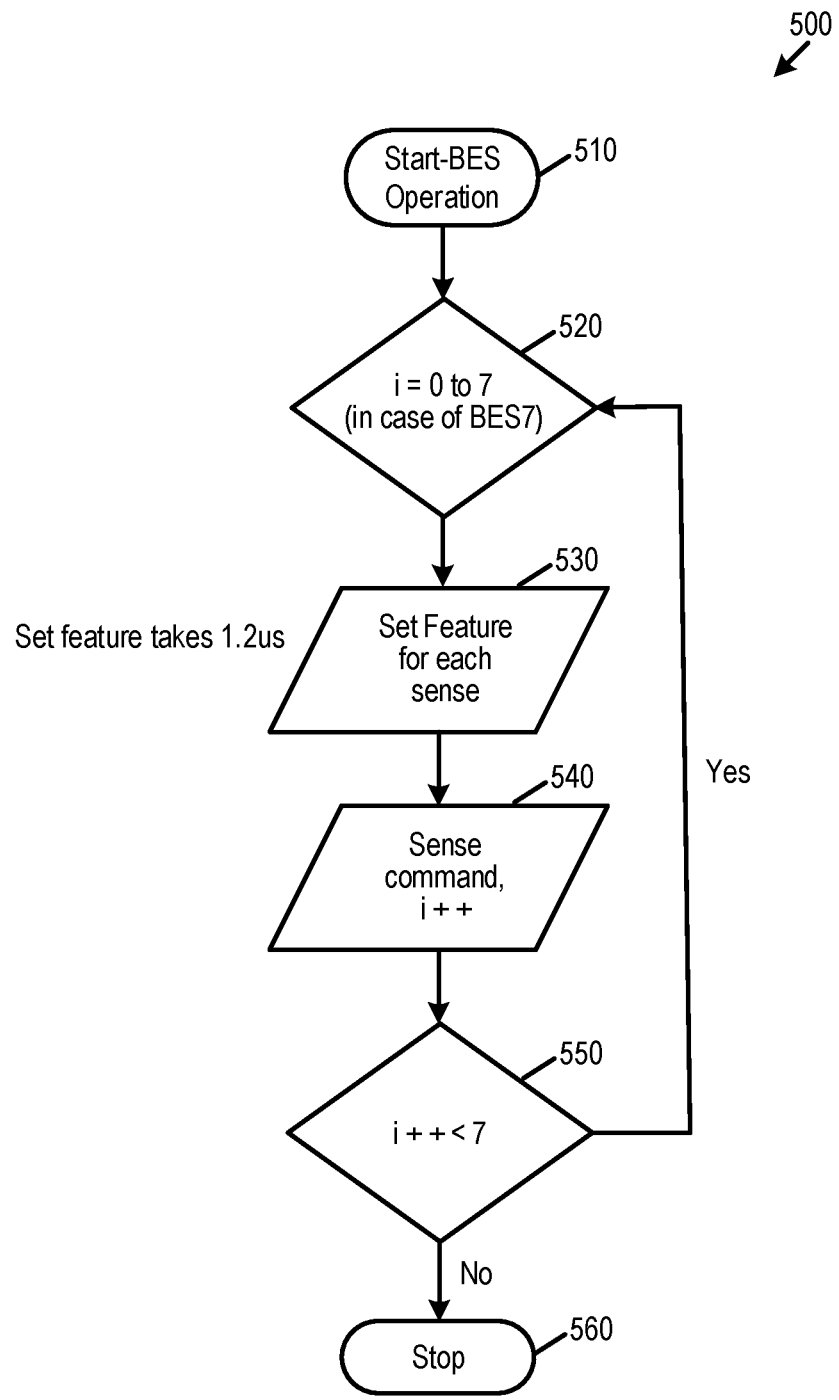
FIG. 5 is a flow chart of a bit-error-rate estimate and scan (BES) operation of an embodiment.

FIG. 5 is a flow chart of a BES operation of an embodiment. As shown in FIG. 5, when the BES operation starts (act 510), the controller 102 set the value of "i" to the number of different reading voltage levels that will be used (seven in the example of BES-7) (act 520). The controller 102 then performs a loop (acts 530, 540, 550) to read the memory cells using each of the i number of different reading voltage levels. After the last value of i, the BES operation ends (act 560), and the reading voltage level that provided the best read with the fewest number of bit errors is chosen.

Figure 6:
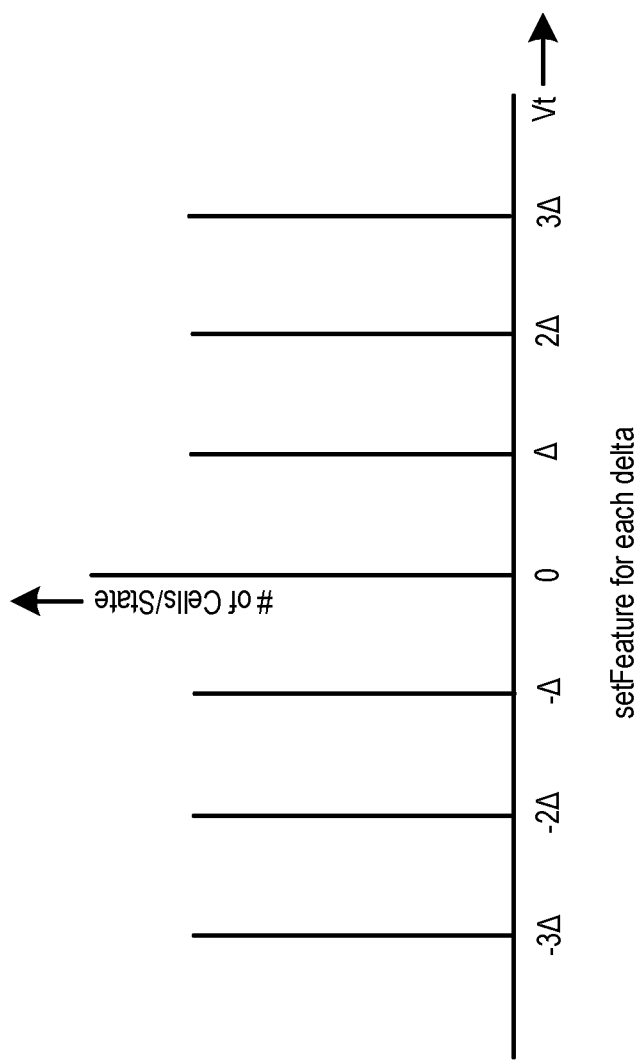
FIG. 6 is a diagram illustrating a BES operation of an embodiment.

In this example, the controller 102 sends a command to the memory 104 to establish each of the different reading voltage levels. So, the controller 102 sends seven commands, one for each of the seven different reading voltage levels tested in a BES-7 operation, as shown in FIG. 6. In one particular implementation (other implementations can be used), the command is referred to as a "setFeature" command, and the different reading voltage levels are referred to as deltas or digital-to-analog converter (DAC) shifts. (A DAC can be used to convert the analog voltage read to a digital state value.)

FIG. 7 is a diagram of a command sequence of an embodiment that the controller 102 sends to the memory 104 to establish different reading voltage levels in a BES operation. It should be understood that this is merely an example and that other implementations can be used. As shown in FIG. 7, the command sequence of this embodiment comprises a die select field ("Fx"), a setFeature prefix ("D5"), a selection of the SLC/MLC state to be read ("Addr 1/2 cycle"), what delta level/DAC shift to use for each state ("Din"), a dynamic read command ("5D"), a selection of SLC or a page of MLC ("A2/01/02/03"), which wordline to read ("Addr 5/6 cycle"), a sense command ("31"), a toggle data sequence ("05, Addr 5/6 cycle, E0"), and decoded data ("Dout (16K)"). For a BES-7 operation, this command sequence would be sent from the controller 102 to the memory 104 seven times. In this particular example, the setFeature part of this sequence (shown in FIG. 8) takes ~1.2 microseconds (us) to process. So, for one BES-7 operation, a latency of ~8.4 us would be incurred.

As mentioned above, a BES operation can be performed during initialization of the data storage device ("ROM init"), during a read error handling (REH) process, or as part of a cell voltage distribution (CVD) process. Performing a BES operation during those times can result in even greater latencies. For example, during ROM init, if there is an uncorrectable or correctable error scenario, the controller 102 can perform a ROM-CVD operation. In one scenario, both coarse (16 DAC) and fine (three DAC) BES operations can be performed, resulting in a total of 19 DACs being applied. For each DAC, a setFeature is issued, which takes ~1.2 us in this example, which increases ROM-Init time. For example, in an uncorrectable/correctable error on a boot block, the controller 102 may issue 19 setFeature commands (i.e., 16 DAC shifts for coarse and 19 DAC shifts for fine). If each setFeature penalty is ~1.2 us, the overall penalty would be ~22.8 us.

Similarly, during REH or using a CVD tracking module, multiple paths (e.g., coarse, extended/enhanced, fine) can have BES-5 or BES-7 operations, each having five or seven senses with DAC shifts. Also, each DAC shift has a setFeature event involved, which can increase REH latency in the tens of milliseconds. So, as illustrated in the above example, in a BES-7 operation, seven setFeatures are issued, which can add up heavily on REH latency. When seven DAC shifts are used in course, extended, and fine operations, a total of 21 setFeature commands would be sent, resulting in an overall latency penalty of ~25.2 us.

Figure 9:
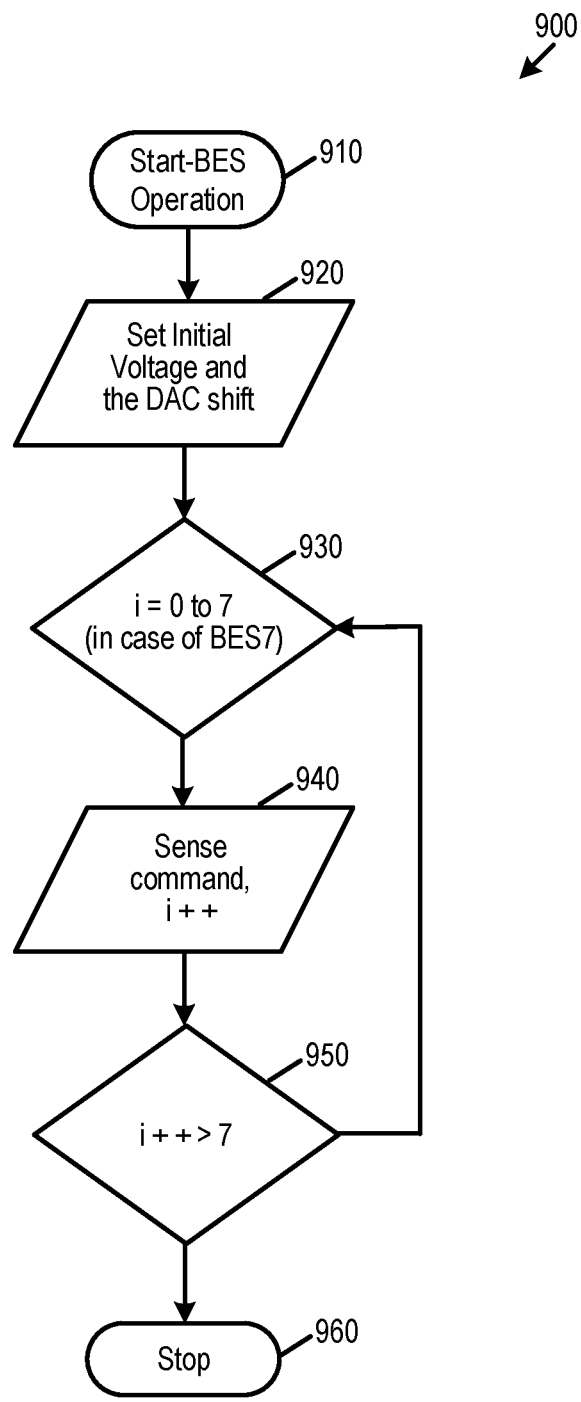
FIG. 9 is a flow chart of a BES operation of an embodiment.

The following embodiments can be used to improve REH time by reducing the time required to perform BES. As shown in the flow chart 900 in FIG. 9, with these embodiments, when the BES operation starts (act 910), the controller 102 can send a command to the memory 104 that sets the initial voltage and DAC shift (act 920), and an auto-incrementing algorithm (acts 930-950) is used to find the reading voltage level that provides the best read with the fewest number of bit errors. In this way, the controller 102 only sends the setFeature command once instead of seven times (for BES-7), which means that, at the end of the process (act 960), much less latency is incurred as compared with the process discussed above. For example, the controller 102 can send a setFeature command to the memory 104 only once either at 0 or −3 delta. In response to the setFeature specifying 0, the memory 104 can start sensing at 0, then at −1 delta, then at −2 delta, then at −3 delta, then at +1 delta, then at +2 delta, and then at +3 delta. In response to the setFeature specifying −3 delta, the memory 104 can start at −3 delta, increment the delta, and sense until it reaches +3 delta.

Figure 10:
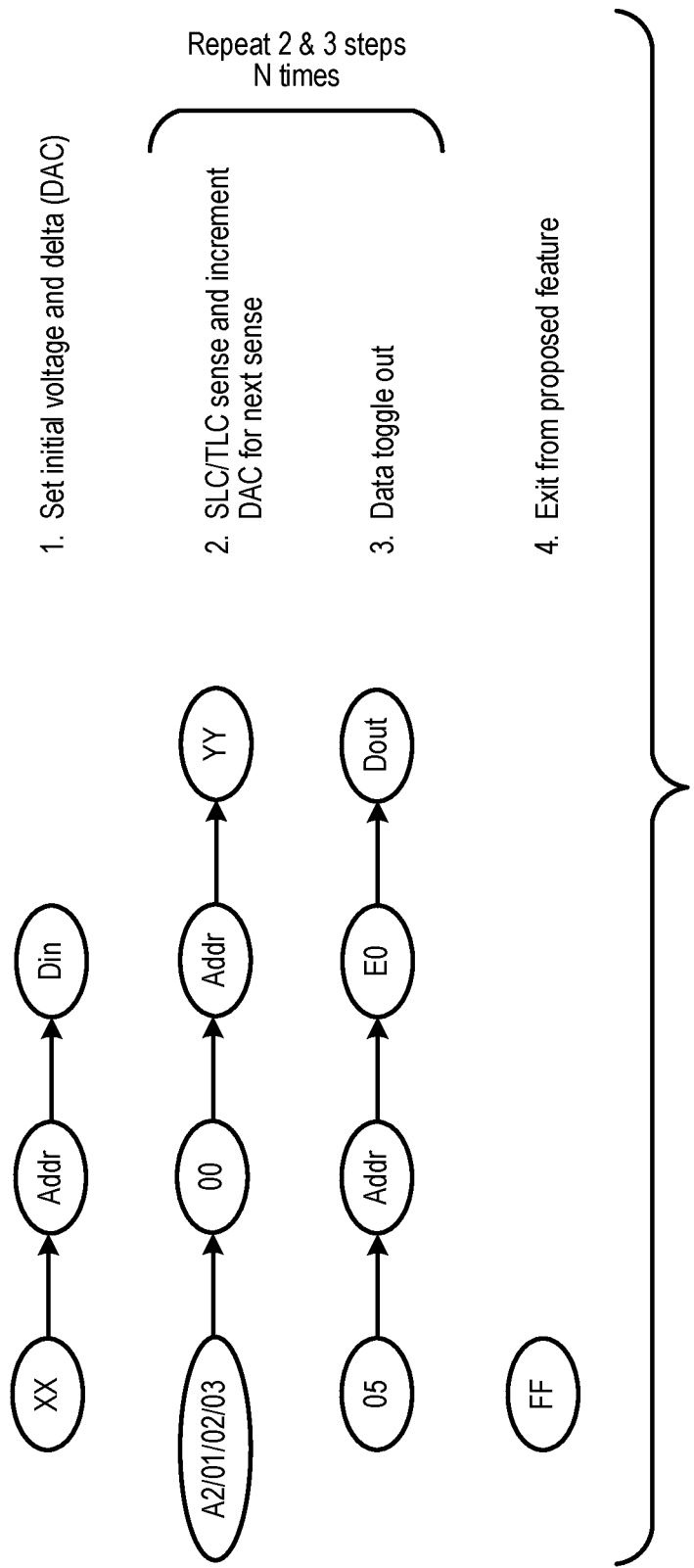
FIG. 10 is an illustration of a command sequence of an embodiment.

In one embodiment, a NAND command sequence is used that specifies the deltas (e.g., 12 DAC shifts) and the number of senses/steps (e.g., seven for BES-7), both of which can be configured by the controller 102, and a command to exit the process (this can be covered in a NAND sequence sheet or issued by the controller 102 to the memory 104). FIG. 10 is an illustration of an example command sequence that can be used. It should be understood that this is merely an example and that other command sequences can be used.

As shown in FIG. 10, in this example, the part of the command sequence sent by the controller 102 to the memory 103 comprises XX, Addr, and Din, where XX is a new NAND command that is a setFeature replacement, Addr being the starting address, and Din being the initial voltage and DAC. Then, the memory 104 performs an SLC/TLC sense and increments the DAC for the next sense (step two of the command sequence) and toggles out the data (step three of the command sequence). CMD YY in step two automatically increments the sense voltage with the DAC provided by CMD XX (e.g., new sense voltage=initial voltage+DAC shift, or previous sense voltage+DAC shift). Steps two and three are performed N number of times (e.g., seven for BES-7, 16 for ROM CVD, etc.). N can be configured in the controller 102 (e.g., picked from a configurable file by the controller 102) or can be specified in the Din part of the command from the controller 102, in which case the data can be sensed out of the memory N times. CMD FF in step four is an automatic exit of the CMD XX sequence.

As shown above, in this example command sequence, two new NAND commands are used: XX and YY. Command XX passes fours bytes of data (initial voltage and the DAC shift), and the DAC is adjusted from the initial voltage by command YY, which is repeated five or seven times in case of BES-5/-7 (and more in the case of ROM-CVD). However, because only one setFeature command is used, the ~1.2 us latency penalty is only incurred once, which reduces overall latency.

Figure 11:
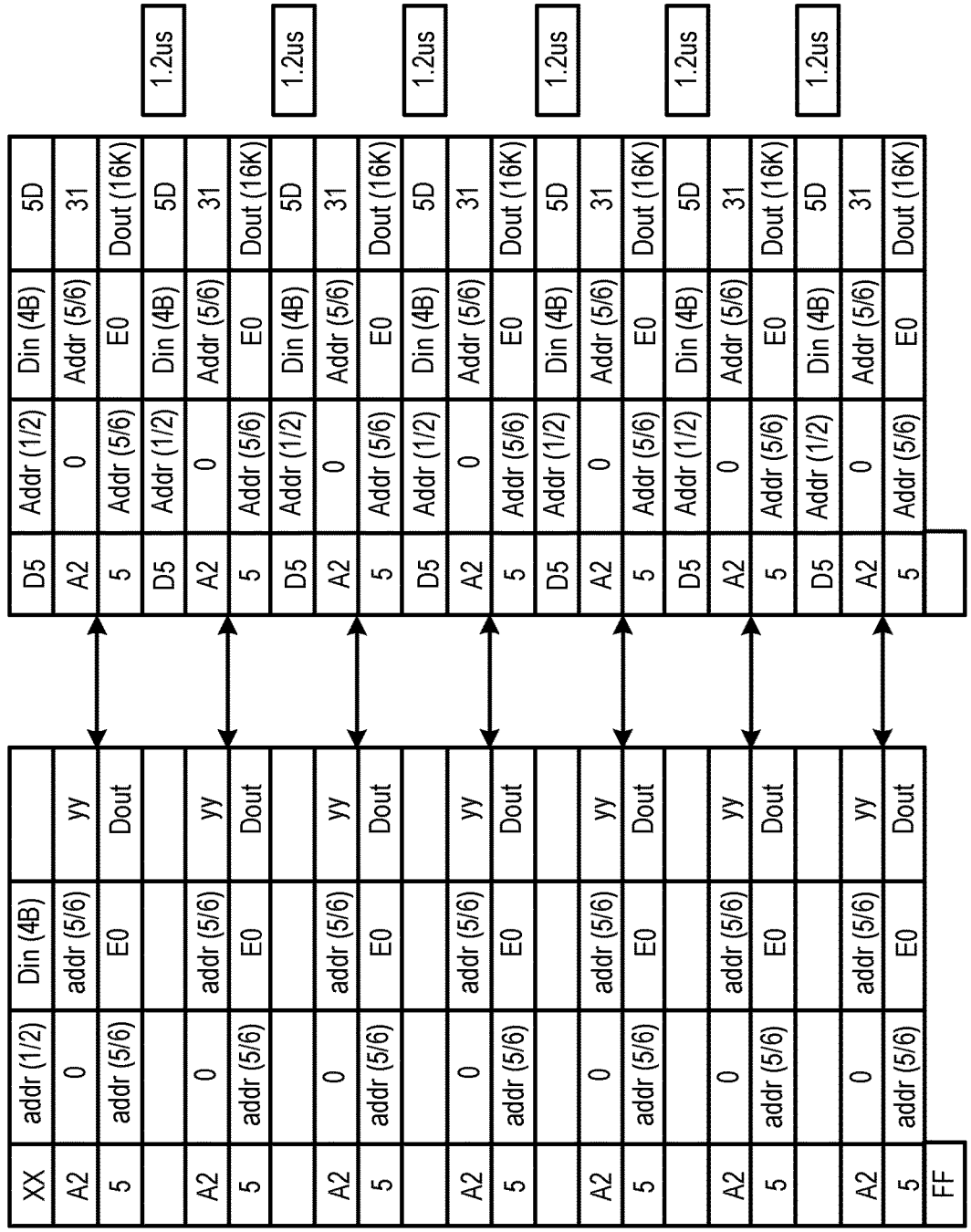
FIG. 11 is a chart illustrating an improvement in exception handling latency of an embodiment.

FIG. 11 is a chart that illustrates the improvement in exception handling latency in one example implementation. The left-hand side of the chart relates to this embodiment, and the right-hand side of the chart relates to the multiple setFeature approach discussed above. In this example implementation, the overall latency improvement in REH and ROM-CVD paths are as following:

| REH (BES) | | ROM CVD | |
| --- | --- | --- | --- |
| Existing: 25.2 us | Saving: 24 us | Existing: 22.8 us | Saving: 20 us |
| Proposed: 1.2 us | Saving %: 95.23 | Proposed: 2.4 us | Saving %: 89.47 |

It should be noted that, even though this embodiment involves the execution of additional commands, there is relatively little (as compared to the other approach described above), if any, overhead associated with these commands. For example, command YY may be viewed as having an equivalent latency to existing commands such as CMD-3D (used for sense and increment VCGR during distribution reads) and CMD 31/30 (used for sensing the data during setFeature), and command XX may be viewed as having an equivalent latency to existing command CMD-D5.

Finally, as mentioned above, any suitable type of memory can be used. Semiconductor memory devices include volatile memory devices, such as dynamic random access memory ("DRAM") or static random access memory ("SRAM") devices, non-volatile memory devices, such as ReRAM, electrically erasable programmable read only memory ("EEPROM"), flash memory (which can also be considered a subset of EEPROM), ferroelectric random access memory ("FRAM"), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two-dimensional (2D) memory structure or a three-dimensional (3D) memory structure.

In a 2D memory structure, the semiconductor memory elements are arranged in a single plane or a single memory device level. Typically, in a 2D memory structure, memory elements are arranged in a plane (e.g., in an x-z direction plane) that extends substantially parallel to a major surface of a substrate that supports the memory elements. The substrate may be a wafer over or in which the layer of the memory elements is formed or it may be a carrier substrate that is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A 3D memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements in each column. The columns may be arranged in a 2D configuration, e.g., in an x-z plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the 2D and 3D structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, which are intended to define the scope of the claimed invention. Finally, it should be noted that any aspect of any of the embodiments described herein can be used alone or in combination with one another.

What is claimed is:

1. A data storage device comprising:
   a memory comprising a plurality of memory cells; and
   a controller coupled with the memory and configured to:
      send a first command to the memory that specifies an initial read voltage threshold and a voltage shift;
      send a second command to the memory a plurality of times, wherein the memory is configured to, each time in response to receiving the second command:
         (a) read data from the plurality of memory cells using a read voltage threshold;
         (b) send the data read from the plurality of memory cells to the controller; and
         (c) increment the read voltage threshold by a multiple of the voltage shift;
      wherein:
         a first time the memory receives the second command, the plurality of memory cells are read using the initial read voltage threshold;
         each subsequent time the memory receives the second command, the plurality of memory cells are read using the initial read voltage threshold incremented by a different multiple of the voltage shift; and
         the memory incrementing the read voltage threshold in response to receiving the second commands avoids a latency that would be incurred by the controller specifying an incremented read voltage threshold.

2. The data storage device of claim 1, wherein the controller is further configured to:
   set a variable that specifies the plurality of times; and
   perform a loop to send the second command to the memory, wherein the loop is repeated based on the variable.

3. The data storage device of claim 1, wherein the second command comprises a setFeature command.

4. The data storage device of claim 1, wherein the plurality of times is configured is by the controller.

5. The data storage device of claim 1, wherein the controller is further configured to:
   perform error correction and determine a number of errors contained in data received from the memory; and
   select a read voltage threshold associated with the data received from the memory that contains a fewest number of errors.

6. The data storage device of claim 1, wherein the first command comprises a subcommand that specifies the initial read voltage threshold.

7. The data storage device of claim 6, wherein the second command further comprises a subcommand for automatically incrementing the multiple of the voltage shift.

8. The data storage device of claim 1, wherein the plurality of memory cells comprise single-level cells.

9. The data storage device of claim 1, wherein the plurality of memory cells comprise multi-level cells.

10. The data storage device of claim 1, wherein the memory comprises a three-dimensional memory.

11. The data storage device of claim 1, wherein the second command comprises a die select field, a setFeature prefix, a selection of a state to be read, a delta level to use for each state, a dynamic read command, an identification of memory to read, a sense command, and/or a toggle data sequence.

12. In a memory of a data storage device, a method comprising:
   receiving, from a controller of the data storage device, a first command specifying an initial voltage level and a digital-to-analog converter (DAC) shift;
   receiving, from the controller of the data storage device, a second command a plurality of times; and
   each time in response to receiving the second command:
      (a) reading data from a plurality of memory cells in the memory using a read voltage level;
      (b)
      sending the data read from the plurality of memory cells to the controller; and
      (c) incrementing the read voltage threshold by a multiple of the DAC shift;
   wherein:
      a first time the memory receives the second command, the plurality of memory cells are read using the initial read voltage threshold;
      each subsequent time the memory receives the second command, the plurality of memory cells are read using the initial read voltage threshold incremented by a different multiple of the DAC shift; and
      the memory incrementing the read voltage threshold in response to receiving the second commands avoids a latency that would be incurred by the controller specifying an incremented read voltage threshold.

13. The method of claim 12, wherein the memory performs (a)-(c) in response to receiving the initial voltage level from the controller only a single time.

14. The method of claim 12, wherein the plurality of times is configured by the controller.

15. The method of claim 12, wherein the first command comprises a subcommand that specifies the initial voltage level and the DAC shift.

16. The method of claim 12, further comprising performing a bit-error-rate estimate and scan (BES) operation, wherein (a)-(c) are performed as part of the BES operation.

17. The method of claim 12, further comprising performing an initialization process, wherein (a)-(c) are performed as part of the initialization process.

18. The method of claim 12, further comprising performing a read error handling (REH) process, wherein (a)-(c) are performed as part of the REH process.

19. The method of claim 12, further comprising performing a cell voltage distribution (CVD) process, wherein (a)-(c) are performed as part of the CVD process.

20. A memory in a data storage device, the memory comprising:
a plurality of memory cells;
means for receiving, from a controller of the data storage device, a first command specifying an initial voltage level and a digital-to-analog converter (DAC) shift;
means for receiving, from the controller of the data storage device, a second command a plurality of times; and
means for each time in response to receiving the second command:
(a) reading data from a plurality of memory cells in the memory using a read voltage level;
(b) sending the data read from the plurality of memory cells to the controller; and
(c) incrementing the read voltage threshold by a multiple of the DAC shift;
wherein:
a first time the memory receives the second command, the plurality of memory cells are read using the initial read voltage threshold;
each subsequent time the memory receives the second command, the plurality of memory cells are read using the initial read voltage threshold incremented by a different multiple of the DAC shift; and
the memory incrementing the read voltage threshold in response to receiving the second commands avoids a latency that would be incurred by the controller specifying an incremented read voltage threshold.

* * * * *